US012599938B2

(12) United States Patent
Park et al.

(10) Patent No.: US 12,599,938 B2
(45) Date of Patent: Apr. 14, 2026

(54) SUBSTRATE PROCESSING APPARATUS USING SUPERCRITICAL FLUID AND DRIVING METHOD THEREOF

(71) Applicant: Samsung Electronics Co., Ltd., Suwon-si (KR)

(72) Inventors: Sang Jine Park, Suwon-si (KR); Ji Hwan Park, Suwon-si (KR); Kun Tack Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 39 days.

(21) Appl. No.: 18/627,651

(22) Filed: Apr. 5, 2024

(65) Prior Publication Data

US 2025/0091101 A1      Mar. 20, 2025

(30) Foreign Application Priority Data

Sep. 18, 2023      (KR) ........................ 10-2023-0124074

(51) Int. Cl.
| | |
|---|---|
| *B08B 13/00* | (2006.01) |
| *B08B 7/00* | (2006.01) |
| *H01L 21/67* | (2006.01) |

(52) U.S. Cl.
CPC ...... *B08B 7/0021* (2013.01); *H01L 21/67028* (2013.01)

(58) Field of Classification Search
None
See application file for complete search history.

(56) References Cited

U.S. PATENT DOCUMENTS

| | | | |
|---|---|---|---|
| 2007/0240740 A1 | 10/2007 | McDermott | |
| 2011/0289793 A1 | 12/2011 | Hayashi et al. | |
| 2012/0064727 A1 | 3/2012 | Oh et al. | |
| 2024/0173753 A1* | 5/2024 | Sumi ..................... | H01L 21/304 |

FOREIGN PATENT DOCUMENTS

| | | | | |
|---|---|---|---|---|
| JP | 4649322 B2 * | 3/2011 | | |
| JP | 5274939 B2 * | 8/2013 | | |
| JP | 2021-086857 A | 6/2021 | | |
| KR | 101681190 B1 * | 12/2016 | ....... | H01L 21/02046 |
| KR | 10-2120493 B1 | 6/2020 | | |

* cited by examiner

*Primary Examiner* — Eric W Golightly
(74) *Attorney, Agent, or Firm* — Muir Patent Law, PLLC

(57) ABSTRACT

A substrate processing apparatus includes a reactor having a processing space formed therein, a fluid supply unit supplying a supercritical fluid into the processing space of the reactor, and a controller controlling the reactor and the fluid supply unit. The controller controls, in response to whether a state of the supercritical fluid supplied to the reactor satisfies a set condition, the reactor and the fluid supply unit to perform one of cleaning of the processing space by using the supercritical fluid and drying of a substrate seated in the processing space by using the supercritical fluid.

8 Claims, 14 Drawing Sheets

| Pre AVC | | Mid AVC | | Mid AVC | | | Post AVC |
|---|---|---|---|---|---|---|---|
| AVC2 (S610) | WF1 (S620) | AVC2 (S611) | WF2 (S621) | AVC2 (S612) | · · · · · · | WFn (S629) | AVC2 (S630) |

SUBSTRATE PROCESSING APPARATUS USING SUPERCRITICAL FLUID AND DRIVING METHOD THEREOF

CROSS-REFERENCE TO RELATED APPLICATION

This application claims priority from Korean Patent Application No. 10-2023-0124074 filed on Sep. 18, 2023 in the Korean Intellectual Property Office and all the benefits accruing therefrom under 35 U.S.C. 119, the contents of which in its entirety are herein incorporated by reference.

BACKGROUND

Technical Field

The present disclosure relates to a substrate processing apparatus using a supercritical fluid and a driving method thereof.

Description of the Related Art

Various processes such as photolithography, etching, ashing, ion implantation, thin film deposition and cleaning are carried out when a semiconductor device or a display device is fabricated. In this case, the photolithography process includes a coating process, an exposure process and a development process. A photoresist film is formed on a substrate (i.e., the coating process), a circuit pattern is exposed on the substrate on which the photoresist film is formed (i.e., the exposure process), and the exposed region of the substrate is selectively developed (i.e., the development process). Afterwards, a developing solution used in the development process is dried.

When the developing solution is dried by a spin method, problems such as photoresist film leaning, bridge, hopping and collapse may occur.

When the developing solution is dried using the supercritical fluid, since the supercritical fluid is not mixed well with a photoresist film component in the developing solution, the photoresist film component may be extracted to remain on the substrate. The inside of a dryer may be contaminated by such a photoresist film component.

BRIEF SUMMARY

An object of the present disclosure is to provide a substrate processing apparatus capable of stably and efficiently drying a developing solution.

According to an aspect of the present disclosure, a substrate processing apparatus includes a reactor having a processing space formed therein, a fluid supply unit supplying a supercritical fluid into the processing space of the reactor, and a controller controlling the reactor and the fluid supply unit. The controller controls, in response to whether a state of the supercritical fluid supplied to the reactor satisfies a set condition, the reactor and the fluid supply unit to perform one of cleaning of the processing space by using the supercritical fluid and drying of a substrate seated in the processing space by using the supercritical fluid.

According to an aspect of the present disclosure, a substrate processing apparatus includes a first chamber in which a developing solution treatment process is performed, a second chamber in which a drying process is performed using a supercritical fluid, and a controller controlling the first chamber and the second chamber. The controller controls a first substrate to be placed in the first chamber, performs first cleaning on a processing space of the second chamber by using a supercritical fluid having a first state which does not satisfy a set condition, performs a developing solution treatment process on the first substrate placed in the first chamber, transfers the first substrate, on which the developing solution treatment process has been performed, from the first chamber to the second chamber, and performs a first drying process on the first substrate by using a supercritical fluid having a second state that satisfies the set condition.

Another object of the present disclosure is to provide a driving method of a substrate processing apparatus capable of stably and efficiently drying a developing solution.

According to an aspect of the present disclosure, a driving method of a substrate processing apparatus includes placing a first substrate into a first chamber, performing first cleaning on a processing space of a second chamber by using a supercritical fluid, wherein that the supercritical fluid has a first state which does not satisfy a set condition, performing, after the supercritical fluid having a second state which satisfies the set condition, a developing solution treatment process on the first substrate placed in the first chamber, transferring the first substrate, on which the developing solution treatment process has been performed, from the first chamber to the second chamber, and performing a drying process on the first substrate by using the supercritical fluid having the second state that satisfies the set condition.

The objects of the present disclosure are not limited to those mentioned above and additional objects of the present disclosure, which are not mentioned herein, will be clearly understood by those skilled in the art from the following description of the present disclosure.

A substrate processing apparatus according to one aspect of the present disclosure to achieve the above objects comprises a reactor having a processing space formed therein, a fluid supply unit supplying a supercritical fluid into the reactor, and a controller controlling the reactor and the fluid supply unit, wherein the controller controls cleaning of the processing space by using the supercritical fluid when the supercritical fluid supplied to the reactor does not satisfy a set condition, and controls drying of a substrate seated in the processing space by using the supercritical fluid when the supercritical fluid supplied to the reactor satisfies the set condition.

Details of the other embodiments are included in the detailed description and drawings.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail example embodiments thereof with reference to the attached drawings, in which:

FIG. 4 is a view illustrating a fluid supply unit shown in FIG. 1;

FIG. 13 is a view illustrating a driving method of a substrate processing apparatus according to some embodiments of the present disclosure.

DETAILED DESCRIPTION OF THE DISCLOSURE

Figure 1:
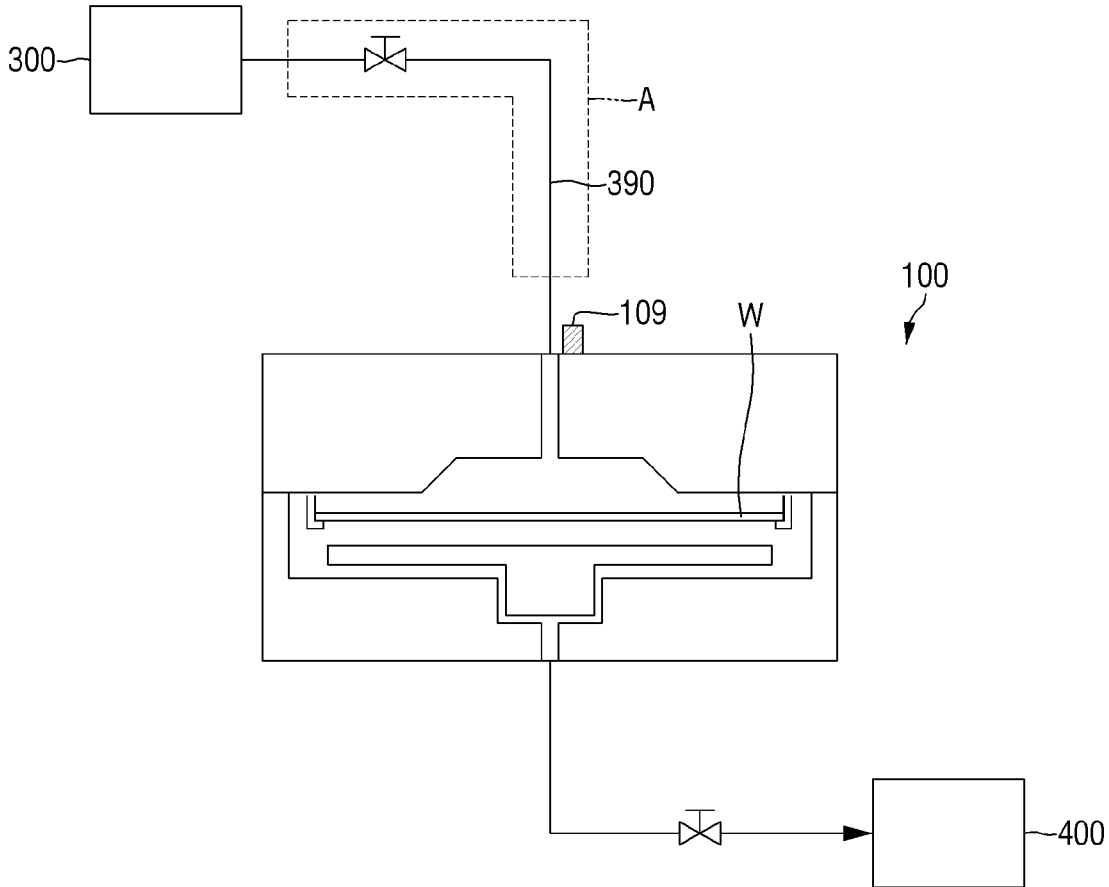
FIG. 1 is a conceptual view illustrating a substrate processing apparatus according to some embodiments of the present disclosure.

Hereinafter, the embodiments of the present disclosure will be described in detail with reference to the accompanying drawings. The same reference numerals will be used for the same elements on the drawings, and a repeated description of the corresponding elements will be omitted.

FIG. 1 is a conceptual view illustrating a substrate processing apparatus according to some embodiments of the present disclosure.

Referring to FIG. 1, the substrate processing apparatus according to some embodiments of the present disclosure includes a reactor 100, a fluid supply unit 300 and an exhaust unit 400. A controller (not shown) controls an overall operation of the substrate processing apparatus such as the reactor 100, the fluid supply unit 300 and the exhaust unit 400.

The reactor 100 includes a processing space formed therein so that a process for a supercritical fluid is performed. The process for the supercritical fluid may be a drying process, a deposition process or the like, but is not limited thereto. Hereinafter, the drying process will be described as an example. An example configuration of the reactor 100 will be described in detail with reference to FIGS. 2 and 3.

The fluid supply unit 300 serves to generate, store and supply the supercritical fluid. An example configuration of the fluid supply unit 300 will be described in detail with reference to FIG. 4.

The exhaust unit 400 exhausts the fluid inside the reactor 100 to the outside of the processing space.

The supercritical fluid is a material having a temperature and a pressure, which are higher than or equal to a critical point of the material, and has diffusivity of a gas phase of the material and solubility of a liquid phase of the material. As the material of the supercritical fluid, carbon dioxide ($CO_2$), water ($H_2O$), methane ($CH_4$), ethane ($C_2H_6$), propane ($C_3H_8$), ethylene ($C_2H_4$), propylene ($C_3H_6$), methanol ($CH_3OH$), ethanol ($C_2H_5OH$), acetone ($C_3H_6O$) or the like may be used, but is not limited thereto. Hereinafter, carbon dioxide will be described as an example material of the supercritical fluid.

A supply pipe 390 (see region A) connected to the reactor 100 may maintain a normal pressure/room temperature state. That is, at least a portion of the supply pipe 390 is exposed to a temperature lower than a set temperature and a pressure lower than a set pressure. In order to avoid safety accident, when the supercritical process is not performed, the inside of the supply pipe 390 is maintained without the supercritical fluid (i.e., the supercritical fluid is discharged from the inside of the supply pipe 390). Therefore, when the supercritical process starts, a fluid of a high temperature/ultra-high pressure supplied from the fluid supply unit 300 may cause heat loss and pressure loss when passing through the supply pipe 390 of a room temperature/normal pressure. Therefore, the fluid may not maintain a normal supercritical state due to heat loss and pressure loss. That is, the fluid in which heat loss and pressure loss are generated may be supplied to the reactor 100 in an unstable state in which liquid, gas and the like are mixed. The fluid of such an unstable state may lower a drying capability, thereby causing a process defect.

In the substrate processing apparatus according to some embodiments of the present disclosure, a sensor 109 for measuring a state of the supercritical fluid supplied to the reactor 100 may be installed in the reactor 100. The state of the supercritical fluid may be, for example, a temperature and/or a pressure, but is not limited thereto. For example, a temperature and/or a pressure of the supercritical fluid measured by the sensor 109 may represent the state of the supercritical fluid.

According to the sensing result, the drying process of the substrate may be performed or not. Instead of performing the drying process of the substrate, the processing space inside the reactor 100 may be cleaned. For example, when a state of the supplied supercritical fluid does not satisfy a set condition, the processing space is cleaned using the supercritical fluid that does not satisfy the set condition. On the other hand, when a state of the supplied supercritical fluid satisfies the set condition, the substrate seated in the processing space may be dried using the supercritical fluid.

In this case, the set condition is a state of the supercritical fluid, which is capable of efficiently performing the drying process, and may be, for example, a set temperature condition and a set pressure condition. The set temperature condition and the set pressure condition are conditions in which carbon dioxide may sufficiently maintain a supercritical state, and may be preset conditions.

In accordance with the above-described operation, process defects occurring in the substrate after the supercritical drying process may be significantly reduced. By cleaning the inside of the reactor 100, the substrate due to particles inside the reactor 100 may be prevented from being contaminated. Since the supercritical fluid, which satisfies the set condition, is used, an influence that may occur by using an unstable fluid may be minimized. Using a supercritical fluid that meets the specified conditions can help minimize any potential impact that might arise from using an unstable fluid.

Figure 2:
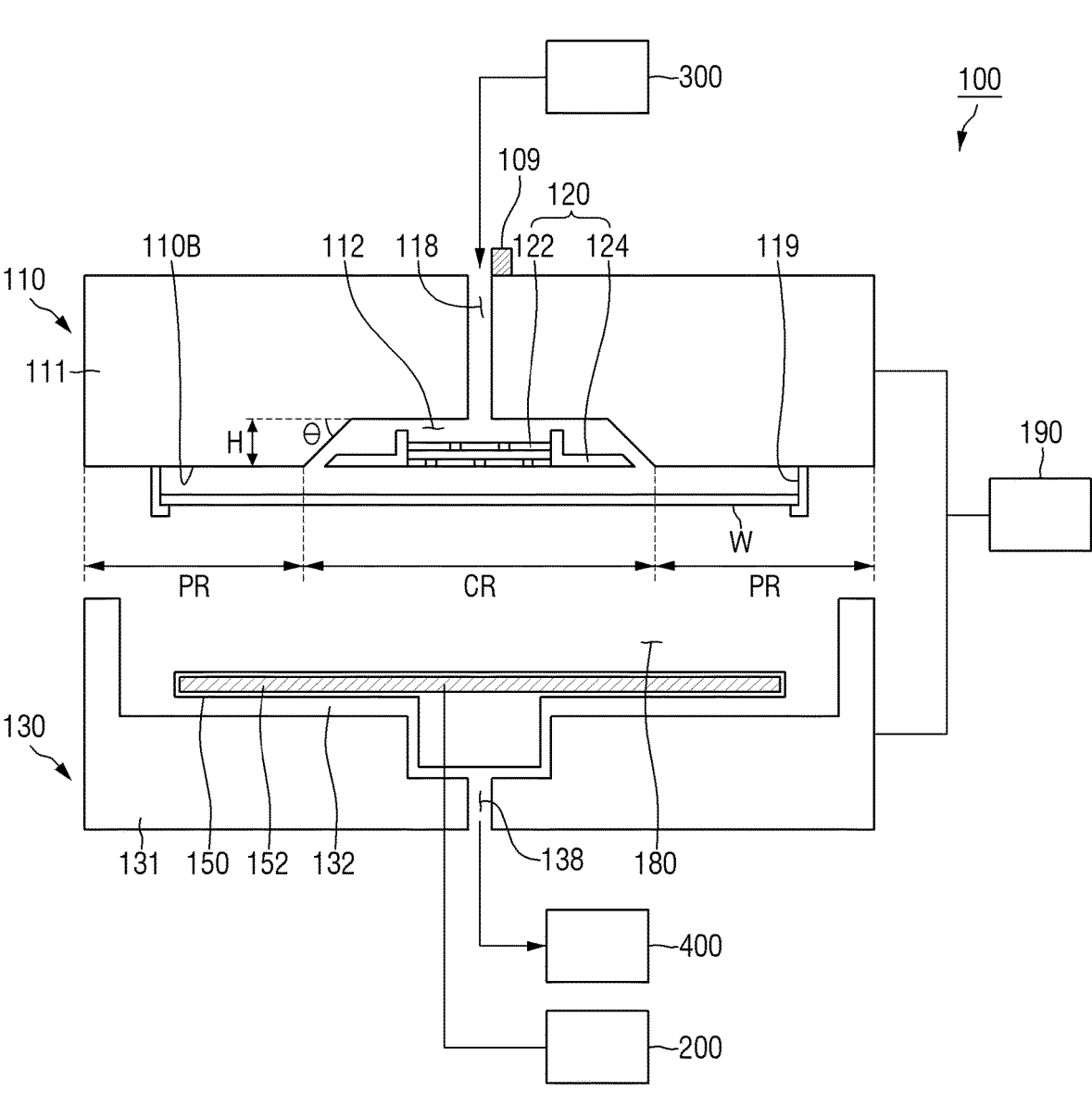
FIGS. 2 and 3 are views illustrating a reactor shown in FIG. 1.
Figure 3:
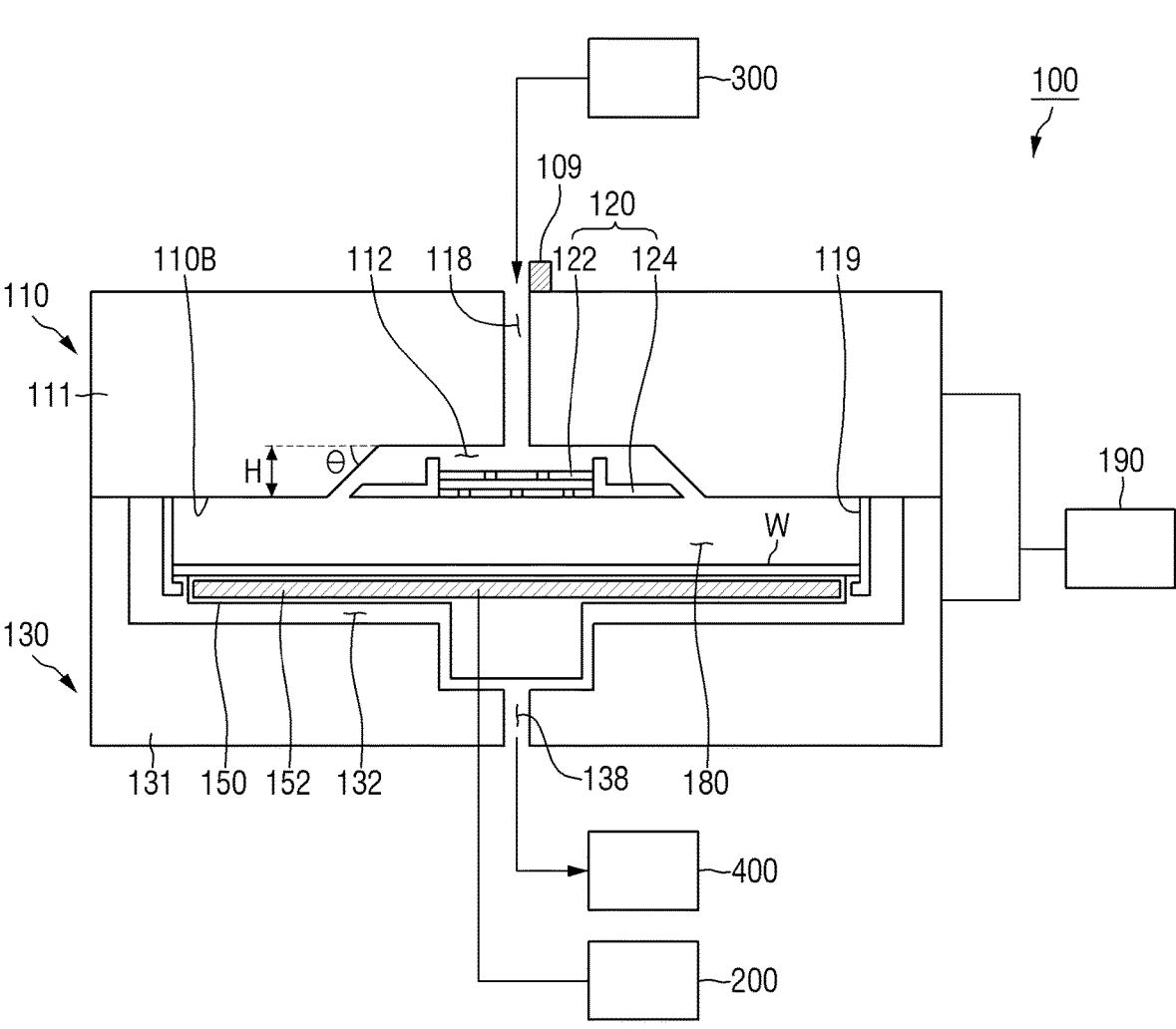

FIGS. 2 and 3 are views illustrating the reactor shown in FIG. 1.

Referring to FIGS. 2 and 3, the reactor 100 includes an upper vessel 110, a support 119, a baffle plate 120, a lower vessel 130, and a support plate (or a hot plate) 150.

The vessels 110 and 130 provide a processing space 180 for processing a substrate W. The vessels 110 and 130 include an upper vessel 110 and a lower vessel 130, and are detachably coupled to each other for opening or closing the vessels 110 and 130. In detail, the upper vessel 110 and the lower vessel 130 may be switched between an open position (see FIG. 2) for opening the processing space 180 and a closed position (see FIG. 3) for sealing the processing space 180 by a driving unit 190. The driving unit 190 moves at least one of the upper vessel 110 and the lower vessel 130 to close or open the processing space 180.

The upper vessel 110 includes a first body 111, a supply port 118, and a first accommodation space 112.

The first body 111 serves as a body of the upper vessel 110, and the supply port 118 and the first accommodation space 112 are formed in the first body 111. The first body 111 may include or may be made of a heat transfer material. In an embodiment, the first body 111 may include or may be made of stainless steel (SUS).

The first body 111 includes a center region CR and a peripheral region PR surrounding the center region CR. The supply port 118 and the first accommodation space 112 are formed in the center region CR. The peripheral region PR may be more protruded toward the processing space 180 than the center region CR. The support 119 may be installed in the peripheral region PR.

The supply port 118 may be installed to pass through the first body 111. The supply port 118 receives the fluid (that is, the supercritical fluid) from the fluid supply unit 300 and transfers the fluid to the first accommodation space 112.

The first accommodation space 112 may be formed on a lower surface (or a bottom surface) 110B of the first body 111. As shown, the first accommodation space 112 may be recessed inward from the lower surface 110B of the first body 111 (or more recessed inward than the peripheral region PR). A depth H of the first accommodation space 112 may be, for example, 10 mm or more.

Sides of the first accommodation space 112 may be inclined. That is, the sides and an upper surface of the first accommodation space 112 may have an angle $\theta$ smaller than 90°. The angle $\theta$ may be, for example, 10° to 70°.

The baffle plate 120 is installed in the first accommodation space 112. The baffle plate 120 diffuses the fluid supplied by the supply port 118 and supplies the fluid to the processing space 180.

The baffle plate 120 includes a base 124 and a plurality of perforated plates 122 (i.e., a plate having a plurality of holes). The perforated plate 122 may be fixed by the base 124. The plurality of perforated plates 122 may be stacked on each other. A perforated position of two adjacent perforated plates of the plurality of perforated plates 122 may be different from each other. That is, when viewed in a vertical direction, the perforated position of the perforated plate 122 installed to be lower is not parallel with that of another perforated plate 122 installed directly thereabove. As the perforated positions are not disposed in a row in the vertical direction, the fluid is sufficiently diffused through the first accommodation space 112 and the baffle plate 120 and then supplied to the substrate W. For example, using the perforated plate 122 with non-overlapping holes in the vertical direction may facilitate to evenly distribute the fluid in the processing space 180.

The support 119 is installed on the lower surface 110B of the upper vessel 110 (that is, on a lower surface of the peripheral region PR). When the vessels 110 and 130 are in the open position (when the upper vessel 110 and the lower vessel 130 are spaced apart from each other), the support 119 is configured to support the substrate W. In an embodiment, the support 119 may have an overhang edge to support the substrate W.

The sensor 109 for measuring the state of the fluid supplied to the reactor 100 is installed in the upper vessel 110. The state of the fluid may be, for example, a temperature and/or a pressure of the fluid, but is not limited thereto. The sensor 109 is installed on an upper portion of the first body 111, and may be installed around the supply port 118 and/or the supply pipe. The installation position of the sensor 109 may be installed at a position different from the shown position. Therefore, the sensor 109 may accurately sense the state of the fluid supplied to the reactor 100.

The lower vessel 130 includes a second body 131, an exhaust port 138, and a second accommodation space 132.

The second body 131 serves as a body of the lower vessel 130, and the exhaust port 138 and the second accommodation space 132 are formed in the second body 131. The second body 131 may include or may be made of a heat transfer material. In an embodiment, the second body 131 may include or may be formed of stainless steel (SUS).

The exhaust port 138 may be installed to pass through the second body 131. The exhaust port 138 exhausts the fluid from the processing space 180 to the outside thereof. The exhaust operation may be controlled by the operation of the exhaust unit 400 connected to the exhaust port 138.

The second accommodation space 132 may be installed on an upper surface of the second body 131. As shown, the second accommodation space 132 may be recessed inward from the upper surface of the second body 131.

The support plate 150 is installed in the lower vessel 130 to face the baffle plate 120. In detail, the support plate 150 is installed in the second accommodation space 132. When the vessels 110 and 130 are changed from the open position to the closed position (in a state that the upper vessel 110 and the lower vessel 130 are in contact with each other), the substrate W may be transferred from the support 119 to the support plate 150 and supported by the support plate 150, but the present disclosure is not limited thereto. That is, even when the vessels 110 and 130 are in the closed position, the substrate W may be supported by the support 119. When the vessels 110 and 130 are in the closed position, the support plate 150 faces a lower surface of the substrate W. The term "contact," as used herein, refers to a direct connection (i.e., physical touching) unless the context indicates otherwise.

A heat source 152 is installed in the support plate 150. The heat source 152 may be, for example, a heater, and may be a pipe through which a fluid of a high temperature flows. The temperature controller 200 supplies the fluid of the high temperature to the pipe to control the temperature of the support plate 150. The present disclosure is not limited thereto. In an embodiment, when the heat source 152 is a heater having a resistive heat element, the temperature controller 200 may supply power to the heater to control the temperature of the support plate 150.

While the supercritical process is being performed in the processing space 180, the support plate 150 is heated by the heat source 152, whereby the temperature of the substrate W is increased. The support plate 150 is controlled to have a higher temperature than the first body 111. In an embodiment, the support plate 150 may be controlled to have a higher temperature than the second body 131. That is, the support plate 150 serves as a hot plate, and the other portions (i.e., the first body 111 and the second body 131) serve as cold walls.

While the supercritical process is being performed in the processing space 180, the support plate 150 is controlled to have a higher temperature than the vessels 110 and 130. For example, while the supercritical process is being performed in the processing space 180, the support plate 150 may be 150° C. or more and 350° C. or less, and the upper vessel 110 and/or the lower vessel 130 may be 35° C. or more and less than 150° C.

When the vessels 110 and 130 are in the closed position and the supercritical process is performed, the fluid is supplied in a supercritical state to the processing space 180. In this case, the support plate 150 is heated, so that the temperature of the substrate W is increased. As the temperature of the substrate W is increased, the supercritical process is intensively performed on the substrate W.

Since the upper vessel 110 and the lower vessel 130 are made of a heat transferable material such as SUS, it is easy to heat the vessels but it is difficult to insulate them. When the upper vessel 110 and the lower vessel 130 are heated, the temperature of the processing space 180 is increased so that supercritical process efficiency in the processing space 180 is increased, but the outside and peripheral devices of the upper vessel 110 and the lower vessel 130 are inevitably affected by the high temperature.

Therefore, in the substrate processing apparatus according to some embodiments of the present disclosure, the support plate 150 is heated to reach 150° C. or more, and the upper vessel 110 and the lower vessel 130 are maintained at a temperature relatively lower than that of the heated support plate 150, whereby the influence to the peripheral devices may be minimized, and at the same time process efficiency for the substrate W may be increased.

Figure 4:
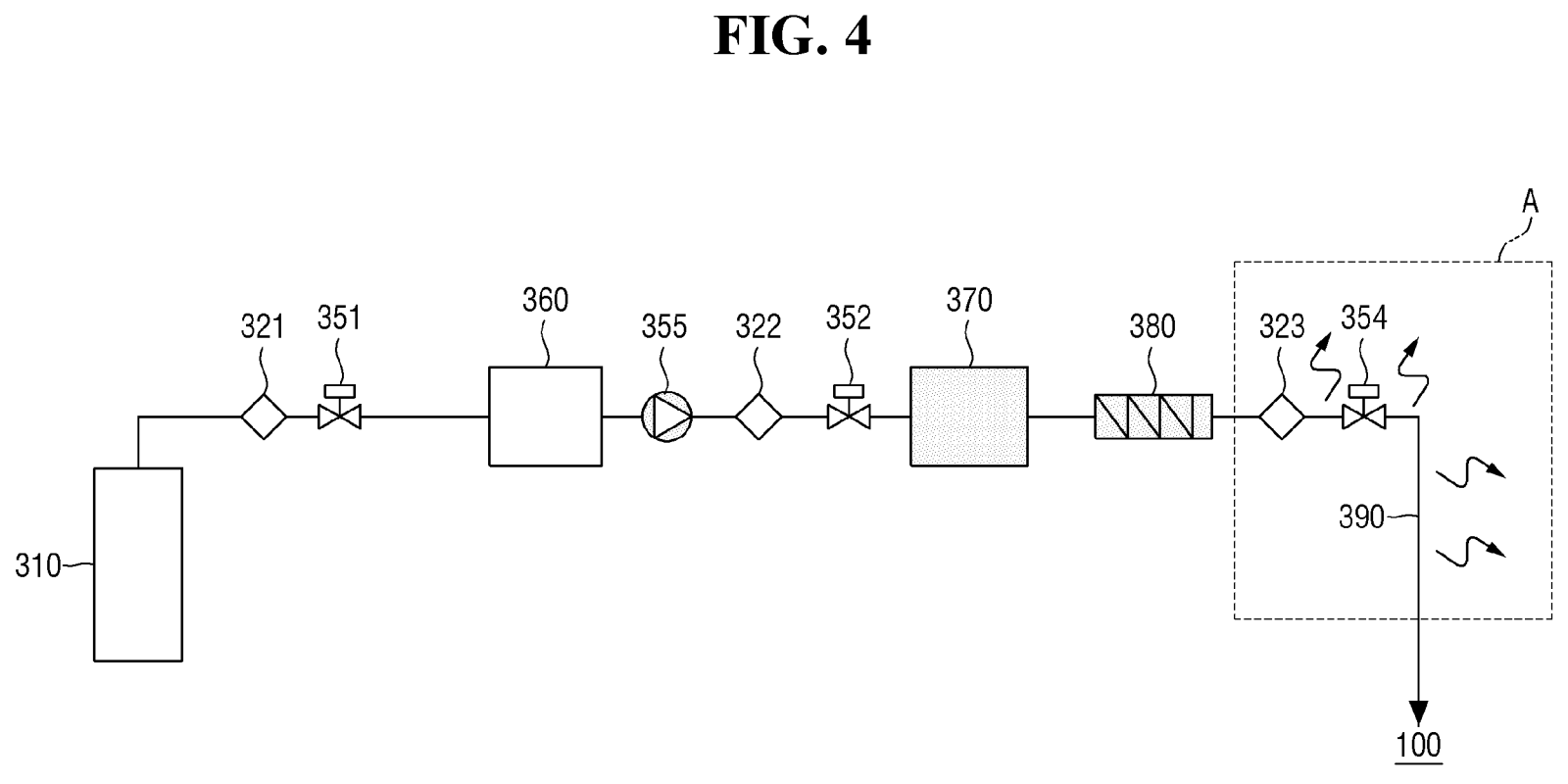

FIG. 4 is a view illustrating a fluid supply unit shown in FIG. 1.

Referring to FIG. 4, the fluid supply unit 300 includes a main tank 310, a condenser 360, a reservoir 370, a heater 380, a plurality of filters 321, 322 and 323, a plurality of valves 351, 352 and 354, and a supply pipe 390.

The main tank 310 may store liquefied carbon dioxide (LCO2). The liquefied carbon dioxide is provided to the condenser 360 through a filter 321 and a valve 351. The liquefied carbon dioxide is compressed to be in a supercritical state while passing through the condenser 360 and the pump 355. The supercritical carbon dioxide is provided to the reservoir 370 through the filter 322 and the valve 352. The reservoir 370 may be controlled at an appropriate pressure and temperature, and may be controlled at, for example, about 180 bar and about 80° C., but is not limited thereto. That is, the reservoir 370 may be controlled to have a critical pressure (7.38 Mpa=73.8 bar) and a critical temperature (304.1K=30.95° C.) of carbon dioxide.

The carbon dioxide of the supercritical state, which is stored in the reservoir 370, is transferred to the reactor 100 through the heater 380, the filter 323 and the valve 354.

The supply pipe 390 (see region A) connected to the reactor 100 maintains a normal pressure/room temperature state. In an embodiment, the supply pipe 390 may be exposed to a room temperature and an atmospheric pressure. Also, in order to avoid safety accident, when the supercritical process is not performed, the inside of the supply pipe 390 is maintained without the supercritical fluid. Therefore, when the supercritical process starts, a fluid of a high temperature/ultra-high pressure, which is supplied from the reservoir 370, may cause heat loss and pressure loss when passing through the supply pipe 390. Therefore, the fluid in which heat loss and pressure loss are generated may not maintain a supercritical state. That is, the fluid in which heat loss and pressure loss are generated may be supplied to the reactor 100 in an unstable state in which liquid, gas and the like are mixed. The fluid of such an unstable state may deteriorate a drying capability, thereby causing a process defect. The process defect that may occur as described above may be removed in a manner that will be described below.

Figure 5:
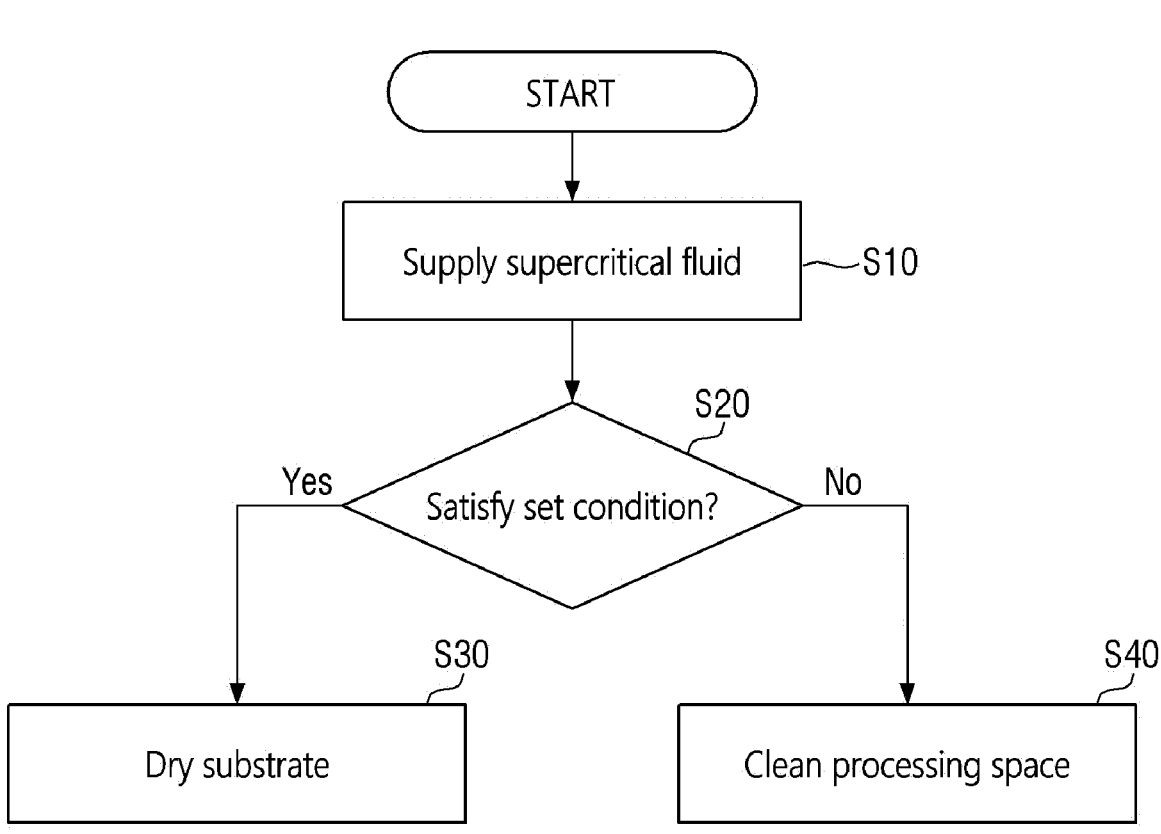
FIG. 5 is a flowchart illustrating a driving method of a substrate processing apparatus according to some embodiments of the present disclosure.

FIG. 5 is a flowchart illustrating a driving method of a substrate processing apparatus according to some embodiments of the present disclosure.

Referring to FIG. 5, the supercritical fluid starts to be supplied to the reactor 100 (S10). The state of the supercritical fluid is measured through the sensor 109.

Then, it is checked whether a state of the supercritical fluid satisfies a set condition (S20).

When the state of the supercritical fluid satisfies the set condition (see YES of S20), the substrate seated in the processing space 180 of the reactor 100 is dried using the supercritical fluid.

On the other hand, when the state of the supercritical fluid does not satisfy the set condition (see NO of S20), the processing space 180 of the reactor 100 is cleaned using the supercritical fluid. For example, when a substrate drying process is performed using the supercritical fluid (that is, unstable supercritical fluid) that does not satisfy the set condition, a process defect may occur and thus cleaning of the processing space 180 is performed instead of drying of the substrate seated in the processing space 180. The processing space 180 of the reactor 100 is cleaned without directly exhausting the unstable supercritical fluid, so that substrate contamination that may be caused by particles in the processing space 180 may be avoided.

Hereinafter, the cleaning operation of the reactor using the supercritical fluid will be described in detail with reference to FIGS. 6 to 9.

Figure 6:
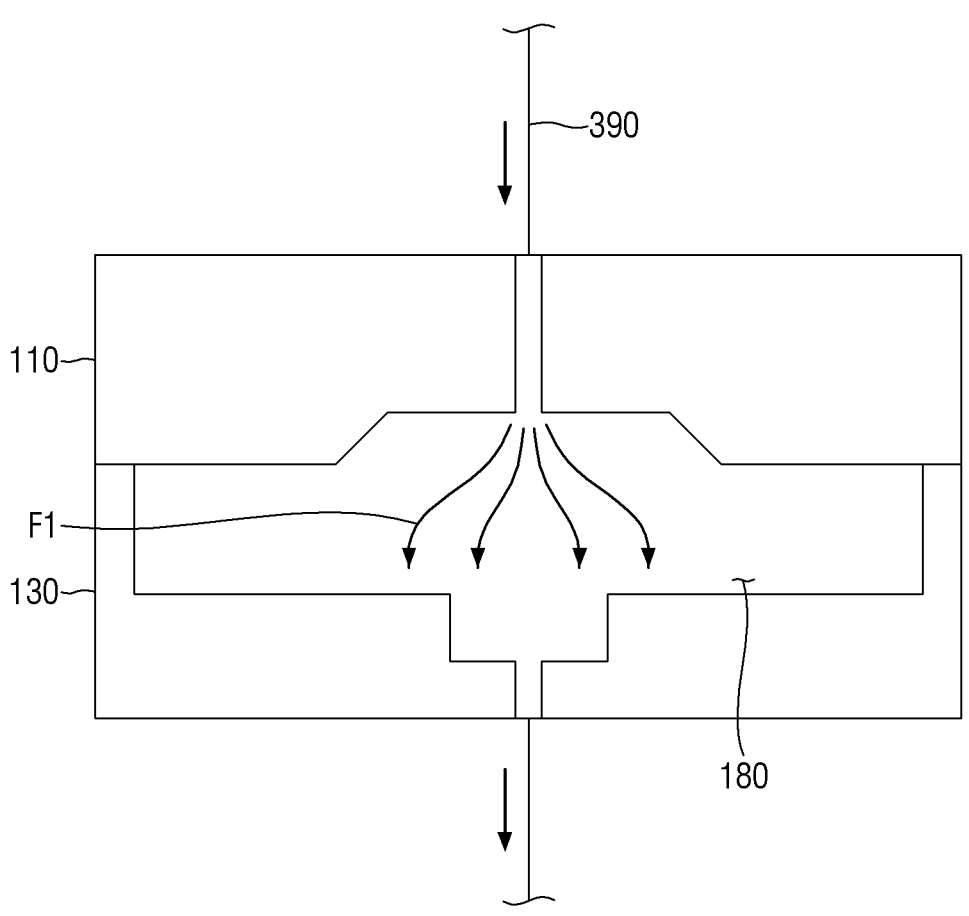
FIGS. 6 to 8 are examples of a cleaning operation of a reactor using a supercritical fluid.
Figure 7:
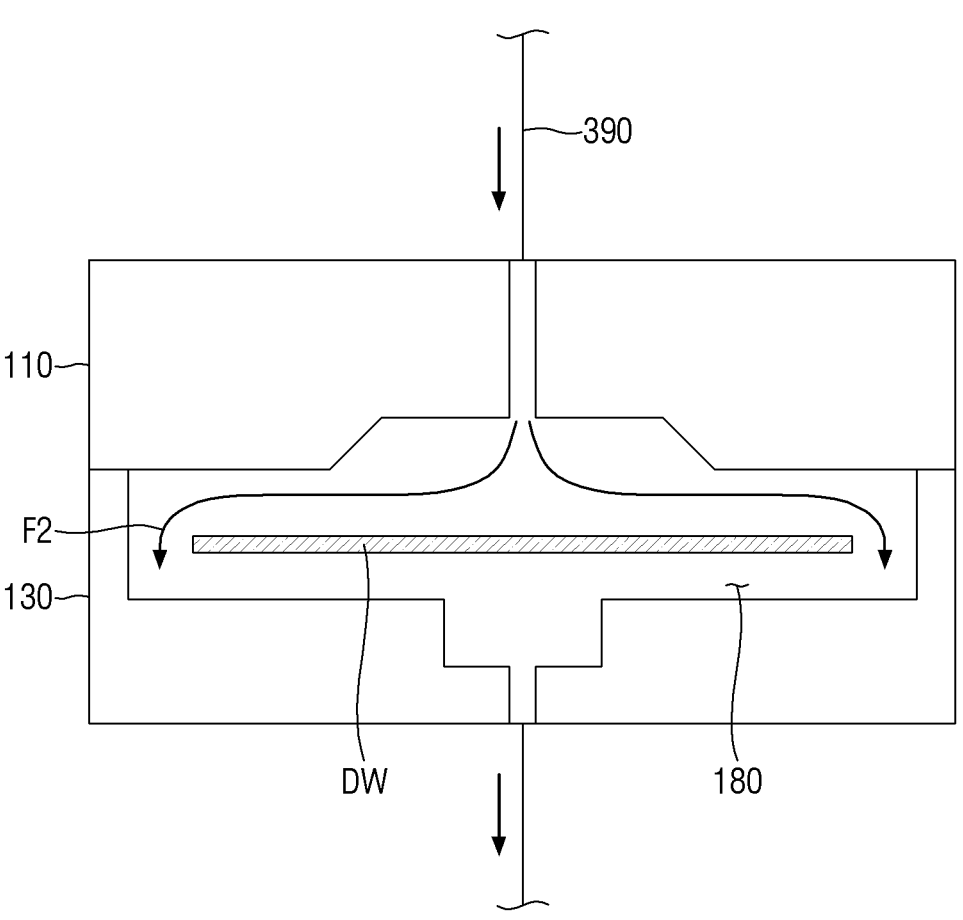
Figure 8:
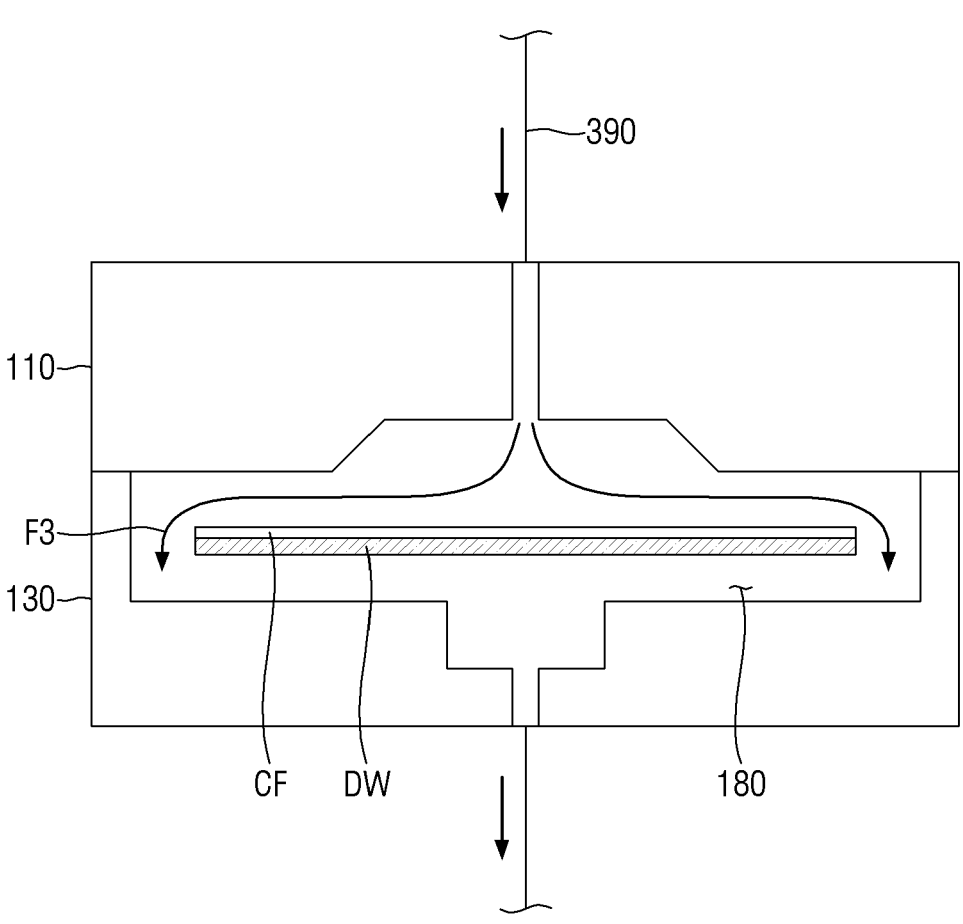
Figure 9:
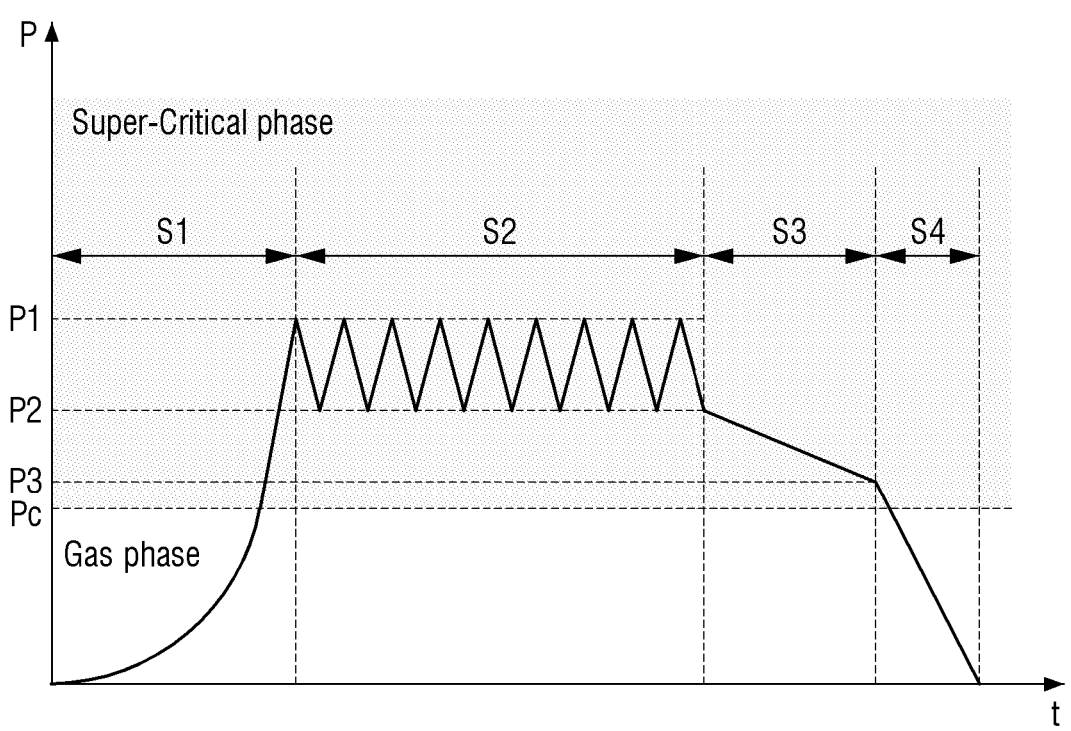
FIG. 9 is a view illustrating an example pressure change inside a reactor while a cleaning operation of a reactor is being performed using a supercritical fluid.

FIGS. 6 to 8 are examples of a cleaning operation of a reactor using a supercritical fluid. FIG. 9 is a view illustrating an example pressure change inside a reactor while a cleaning operation of a reactor is being performed using a supercritical fluid.

As shown in FIG. 6, in a state that the processing space 180 of the reactor 100 is empty, the supercritical fluid is supplied into the processing space 180 to perform a cleaning operation. Since there is no dummy wafer inside the reactor 100, the supercritical fluid may not be diffused to the corner of the processing space 180 of the reactor 100 (see F1). However, even though this method is used, the supercritical fluid of high temperature may increase the temperature of the supply pipe 390 to reach a set temperature while passing through the supply pipe 390. Since this method does not require an operation of inserting/taking out a dummy wafer, the overall cleaning operation time may be shortened.

As shown in FIG. 7, the cleaning operation may be performed in a state that a dummy wafer DW is seated inside the reactor 100. That is, after the dummy wafer DW is seated in the processing space 180, the supercritical fluid is supplied into the processing space 180. As the supercritical fluid is supplied to the processing space 180 of the reactor 100, the supercritical fluid may collide with the dummy wafer DW and then may be diffused up to the corner of the processing space 180 (see F2). Therefore, when this method is used, the temperature of the supply pipe 390 may be sufficiently increased and the processing space 180 may be sufficiently cleaned.

As shown in FIG. 8, the dummy wafer DW may be seated inside the reactor 100, and a cleaning fluid CF is coated on the dummy wafer DW. The cleaning fluid CF is for removing particles remaining in the processing space 180, for example, a carbon component (or a photoresist film component). In an embodiment, the particles may include carbon and may be generated from patterning of a photoresist film. Since the supercritical fluid is not mixed well with the carbon component, it may be difficult to sufficiently remove the carbon component in the processing space 180 only with the supercritical fluid. Therefore, the cleaning process is performed in a state that the dummy wafer DW coated with the cleaning fluid CF is seated inside the reactor 100, whereby the carbon component in the processing space 180 may be sufficiently removed.

Also, as the supercritical fluid is supplied to the processing space 180 of the reactor 100, the supercritical fluid collides with the dummy wafer DW and may be diffused up to the corner of the processing space 180 (see F3). Therefore, the temperature of the supply pipe 390 may be sufficiently increased, and the processing space 180 may be sufficiently cleaned.

Meanwhile, even though the supercritical fluid is discharged to the exhaust unit 400 through the processing space 180, an effect of cleaning the processing space 180 may be obtained. Additionally, pressurization and decompression may be repeated multiple times inside the reactor 100, so that the effect of cleaning the processing space 180 may be maximized. This cleaning method will be described with reference to FIG. 9.

Referring to FIG. 9, at the closed position (see FIG. 3) of the reactor 100, the unstable supercritical fluid is supplied into the reactor 100 through the supply pipe 390. The pressure in the reactor 100 is increased to a first pressure P1 (see step S1). That is, the supercritical fluid may be supplied until the supercritical fluid in the processing space 180 reaches a saturated vapor pressure or a critical pressure. After the fluid in the processing space 180 reaches the saturated vapor pressure, the temperature in the processing space 180 may be increased to a temperature higher than the critical temperature of the fluid in the processing space 180. As a result, the fluid in the processing space 180 reaches the supercritical state.

Then, a supply flow rate of the supercritical fluid supplied into the processing space 180 is adjusted so that the pressure of the processing space 180 is repeatedly increased and lowered within a predetermined range (see step S2). That is, a depressurizing process of depressurizing the pressure of the processing space 180 from the first pressure P1 to the second pressure P2 and a boosting process of boosting the pressure inside the processing space 180 from the second pressure P2 to the first pressure P1 are repeated. In this way, as the depressurizing/boosting process is repeated, the inside of the processing space 180 is cleaned. The first pressure P1 may be, for example, 140 bar and the second pressure P2 may be, for example, 100 bar, but the present disclosure is not limited thereto.

Subsequently, the pressure in the processing space 180 is depressurized from the second pressure P2 to a third pressure P3 (see S3).

Then, the pressure in the processing space 180 is depressurized from the third pressure P3 to a normal pressure (see step S4). In the step S4, the normal pressure is example, and the pressure may be pressurized from the third pressure P3 to another pressure not the normal pressure.

The speed of depressurizing the pressure from the second pressure P2 to the third pressure P3 may be slower than the speed of depressurizing the pressure from the third pressure P3 to the normal pressure. Thus, decompression from the second pressure P2 to the third pressure P3 may be low-speed exhaust, and decompression from the third pressure P3 to the normal pressure may be high-speed exhaust.

Figure 10:
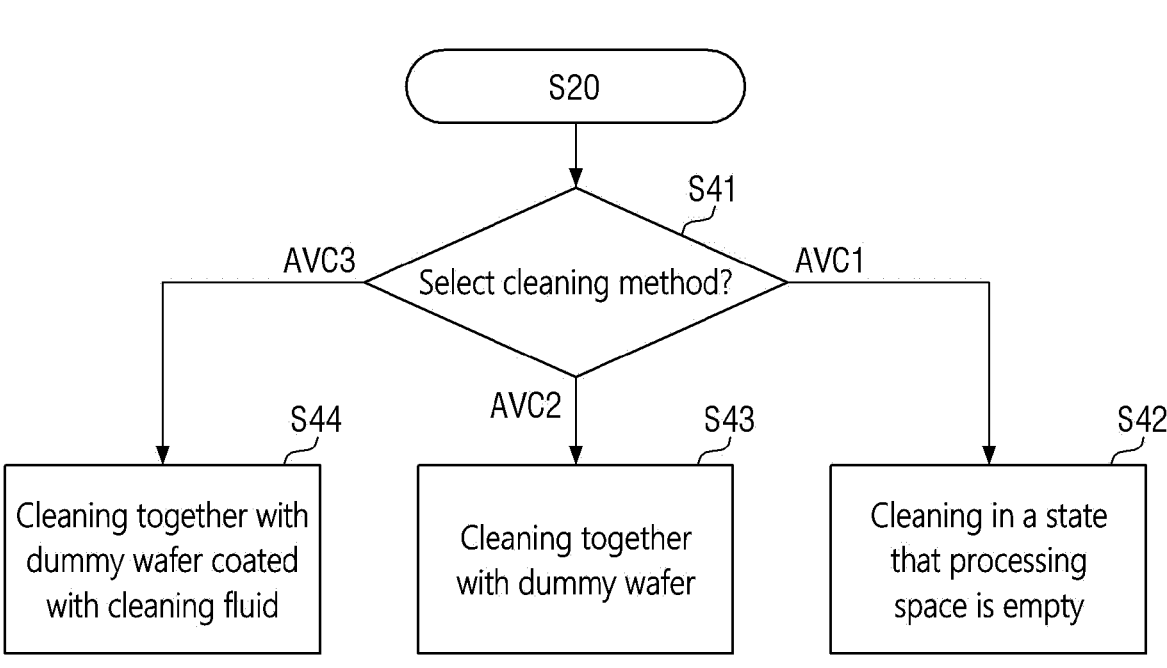
FIG. 10 is a flowchart illustrating a driving method of a substrate processing apparatus according to some embodiments of the present disclosure.

FIG. 10 is a flowchart illustrating a driving method of a substrate processing apparatus according to some embodiments of the present disclosure. For convenience of description, the following description will be based on differences from those described with reference to FIGS. 5 to 9.

Referring to FIG. 10, when a state of the supercritical fluid does not satisfy a set condition (see NO in S20 of FIG. 5), a cleaning method is selected (S41). The cleaning method may be selected using software or the like. In an embodiment, an operator may select the cleaning method.

There may be a variety of cleaning methods, but in some embodiments of the present disclosure, the following three cases are exemplified.

According to the first case (see AVC1), as shown in FIG. 6, the processing space 180 is cleaned in a state that the processing space 180 is empty (S42).

According to the second case (see AVC2), as shown in FIG. 7, in a state that the dummy wafer DW is seated in the processing space 180, the processing space 180 is cleaned (S43).

According to the third case (see AVC3), as shown in FIG. 8, in a state that the dummy wafer DW coated with a cleaning fluid is seated in the processing space 180, the processing space 180 is cleaned (S44).

Figure 11:
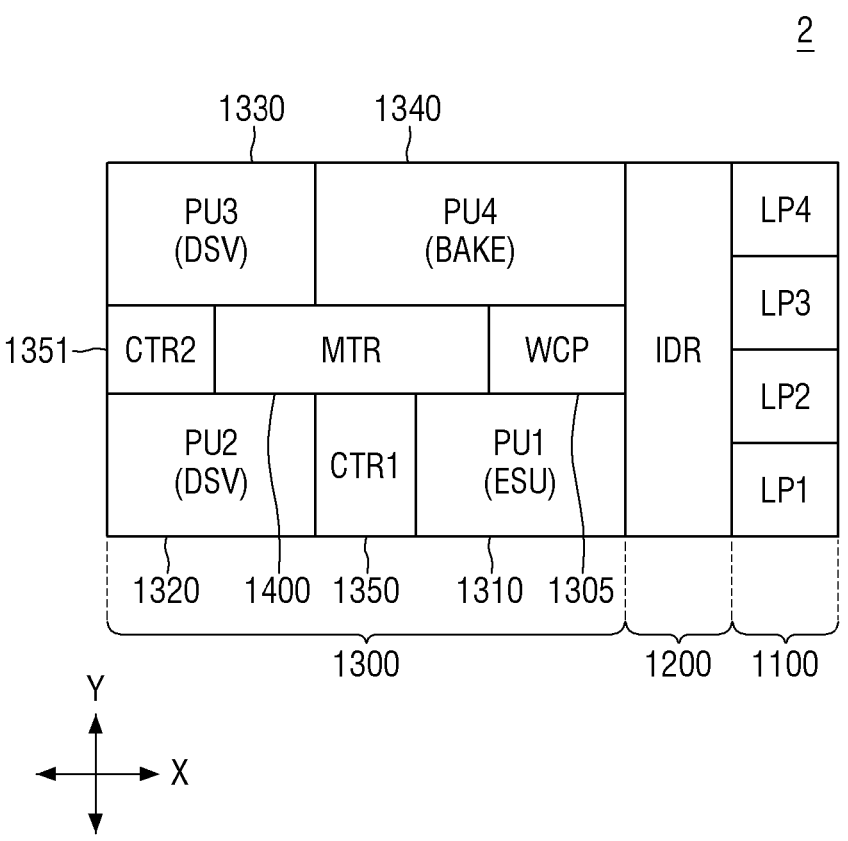
FIG. 11 is a block diagram illustrating a substrate processing apparatus according to some embodiments of the present disclosure.

FIG. 11 is a block diagram illustrating a substrate processing apparatus according to some embodiments of the present disclosure. For convenience of description, the following description will be based on differences from those described with reference to FIGS. 1 to 10.

Referring to FIG. 11, a substrate on which an exposure-processed photoresist film is formed is transferred into a substrate processing apparatus 2. In the substrate processing apparatus 2, a developing process using a developing solution, a drying process using a supercritical fluid and a bake process are sequentially performed.

The substrate processing apparatus according to some embodiments of the present disclosure includes a load port 1100, an index module 1200 and a process module 1300. The load port 1100, the index module 1200 and the process module 1300 may be disposed along a first direction X.

The load port 1100 includes mounting tables on which a container in which a plurality of substrates are accommodated is disposed (see LP1 to LP4). The plurality of substrates may be exposure-processed substrates. The container may be, for example, a front opening unified pod (FOUP), but is not limited thereto. The plurality of mounting tables may be disposed along a second direction Y. In FIG. 11, four mounting tables are exemplarily installed.

The index module 1200 is disposed between the load port 1100 and the process module 1300. For example, the index module 1200 includes a rail installed in an index chamber 210 and an index robot moving along the rail. The index robot includes an arm and a hand to pick up the substrate positioned on the load port 1100 and transfer the substrate to a buffer chamber 1305.

The process module 1300 includes a buffer chamber (WCP) 1305, a transfer chamber (MTR) 1400, a first process chamber (PU1 or ESU) 1310, a second process chamber (PU2 or DSV) 1320, a third process chamber (PU3 or DSV) 1330, a fourth process chamber (PU4 or BAKE) 1340, a first control box (CTR1) 1350, and a second control box (CTR2) 1351.

The buffer chamber 1305 temporarily stores the substrate transferred by the index robot of the index module 1200. The substrate may be adjusted at a preset temperature within the buffer chamber 1305. In addition, at least one of the process chambers 1310, 1320, 1330, and 1340 may temporarily store the substrate in which a process is completed.

The transfer chamber 1400 is disposed to be extended along the first direction X. The transfer chamber 1400 is provided with a guide rail and a transfer robot therein. In an embodiment, the transfer robot moves along the guide rail.

The first process chamber 1310, the first control box 1350 and the second process chamber 1320 may be sequentially disposed on one side in the second direction Y around the transfer chamber 1400. The fourth process chamber 1340 and the third process chamber 1330 may be sequentially disposed on the other side in the second direction Y around the transfer chamber 1400. For example, the transfer chamber 1400 is disposed in a space between the first process chamber 1310 and the fourth process chamber 1340 and in a space between the second process chamber 1320 and the third process chamber 1330.

The first process chamber 1310 supplies a developing solution to the substrate to perform a developing process. An exposure-processed photoresist film may be formed on the substrate. The developing solution is a negative photoresist developing solution, and may be, for example, n-butyl acetate (nBA), but is not limited thereto.

The second process chamber 1320 dries the substrate by using a supercritical fluid. That is, the developing solution remaining on the substrate W is removed using the supercritical fluid.

The third process chamber 1330 may be the same type of chamber as the second process chamber 1320. That is, the third process chamber 1330 dries the substrate by using the supercritical fluid. The third process chamber 1330 may be disposed to face at least a portion of the second process chamber 1320.

The apparatus described in FIGS. 1 to 4 or the method described in FIGS. 5 to 10 may be applied to each of the second process chamber 1320 and the third process chamber 1330.

The fourth process chamber 1340 bakes the substrate dried in the second process chamber 1320 or the third process chamber 1330. The fourth process chamber 1340 may be disposed to face at least a portion of the first process chamber 1310.

The first control box 1350 is a space in which a controller (i.e., a computing device) for controlling a plurality of process chambers (e.g., 1310 and 1320) is installed.

The second control box 1351 is a space in which a controller (i.e., a computing device) for controlling a plurality of process chambers (e.g., 1330 and 1340) is installed.

Hereinafter, the operation of the substrate processing apparatus according to some embodiments of the present disclosure will be described.

The container in which the exposure-processed substrate is accommodated is disposed on the mounting table of the load port 1100. The index robot of the index module 1200 picks up the substrate and transfers the substrate to the buffer chamber 1305.

The transfer robot of the transfer chamber 1400 picks up the substrate from the buffer chamber 1305 and transfers the substrate to the first process chamber 1310. The substrate is developed by the developing solution in the first process chamber 1310.

The transfer robot of the transfer chamber 1400 transfers the substrate from the first process chamber 1310 to the second process chamber 1320 or the third process chamber 1330. In particular, in a state that the developing solution supplied from the first process chamber 1310 remains on the substrate, the substrate is transferred to the second process chamber 1320 or the third process chamber 1330.

In the second process chamber 1320 or the third process chamber 1330, the substrate is dried by the supercritical fluid. The transfer robot of the transfer chamber 1400 transfers the dried substrate from the second process chamber 1320 or the third process chamber 1330 to the fourth process chamber 1340. However, as described above with reference to FIGS. 1 to 10, before or after the substrate is dried in the second process chamber 1320 or the third process chamber 1330, the inside of the reactor may be cleaned by using an unstable supercritical fluid.

In the fourth process chamber 1340, the substrate is baked. The transfer robot of the transfer chamber 1400 transfers the baked substrate from the fourth process chamber 1340 to the buffer chamber 1305.

In the buffer chamber 1305, the temperature of the substrate is controlled.

The index robot of the index module 1200 picks up the substrate from the buffer chamber 1305 and transfers the substrate into the container of the load port 1100.

Figure 12:
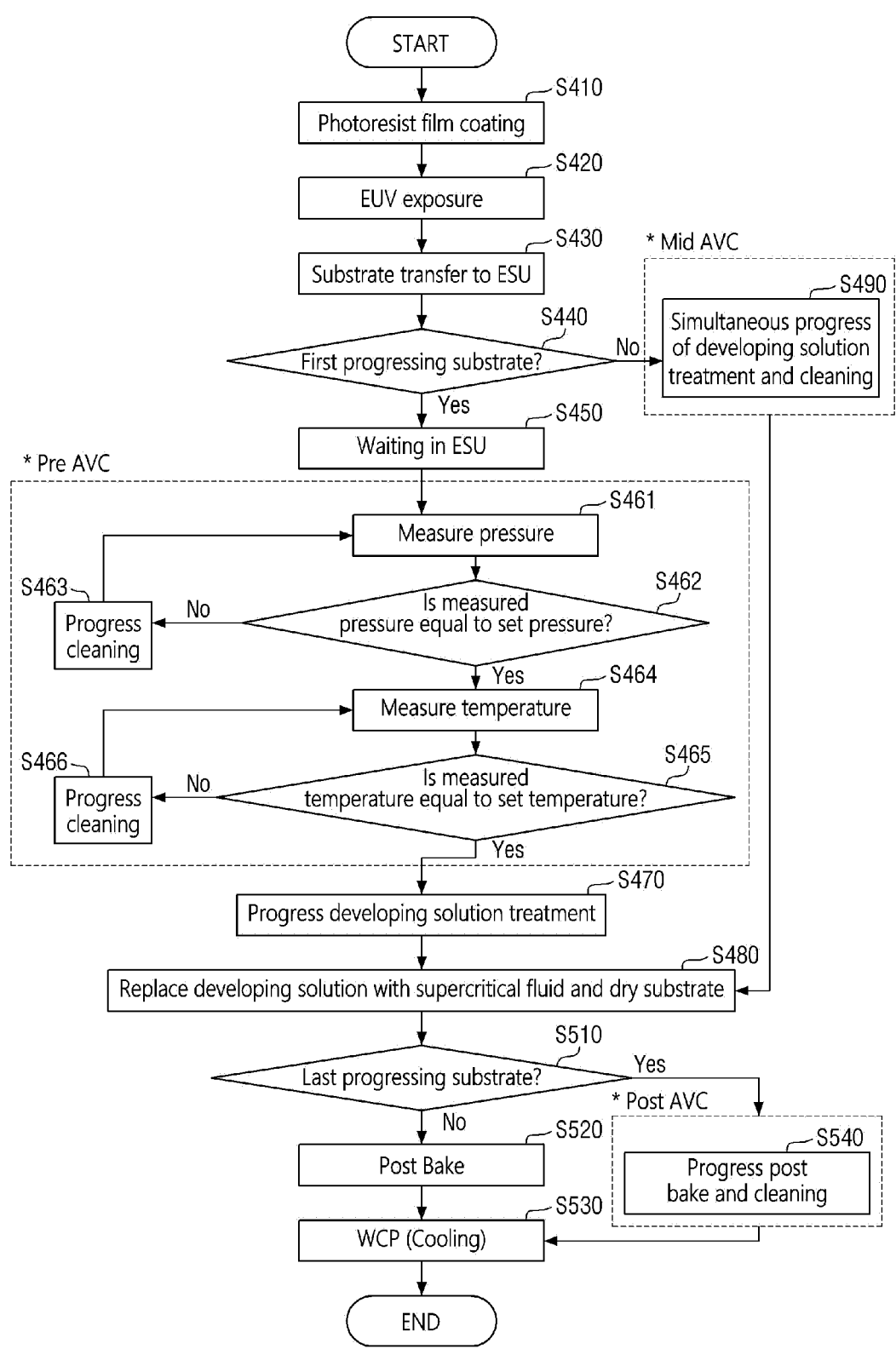
FIG. 12 is a flowchart illustrating a driving method of a substrate processing apparatus according to some embodiments of the present disclosure.

FIG. 12 is a flowchart illustrating a driving method of a substrate processing apparatus according to some embodiments of the present disclosure.

Referring to FIGS. 11 and 12, a photoresist film PR is coated on the substrate (S410).

Then, the photoresist film is exposed using EUV (S420).

Then, the exposed substrate is transferred to a first process chamber ESU (S430).

Subsequently, it is checked whether the substrate is a first progressing substrate (S440). In this case, the first progressing substrate corresponds to a substrate transferred for an initial processing among a plurality of substrates for which a developing solution treatment process is to be performed. In an embodiment, the first progressing substrate may be a substrate to be processed for an initial processing when the substrate processing apparatus enters an idle period and then starts the drying process again.

When the substrate is the first progressing substrate (YES of S440), the substrate transferred into the first process chamber ESU is not treated with the developing solution, and waits in the first process chamber ESU (S450).

Subsequently, it is checked whether a state of a supercritical fluid supplied to a second or third process chamber DSV satisfies a set condition, so as to determine whether to clean a processing space of the second or third process chamber DSV.

In detail, a pressure of the supercritical fluid supplied to the second or third process chamber DSV is measured (S461). The pressure of the supercritical fluid may be measured in the supply pipe that is connected to the reactor of the second or third process chamber DSV, or the pressure inside the reactor may be measured. The pressure of the supercritical fluid may be inferred through the pressure measured as above. In an embodiment, the pressure measured may represent the pressure of the supercritical fluid supplied to the second or third process chamber DSV.

It is checked whether the measured pressure is the same as the set pressure (that is, whether the measured pressure is within the set pressure range) (S462).

When the measured pressure is not the same as the set pressure (NO of S462), the reactor of the second or third process chamber DSV is cleaned by using the unstable supercritical fluid (S463). The cleaning method may be one of the methods of FIGS. 6 to 8.

When the measured pressure is the same as the set pressure (YES of S462), the temperature of the supercritical fluid supplied to the second or third process chamber DSV is measured (S464). The temperature may be measured in the supply pipe that is connected to the reactor of the second or third process chamber DSV, or the temperature inside the reactor may be measured. The temperature of the supercritical fluid may be inferred through the temperature measured as above. In an embodiment, the temperature measured may represent the temperature of the supercritical fluid supplied to the second or third process chamber DSV.

It is checked whether the measured temperature is the same as the set temperature (that is, whether the measured temperature is within the set temperature range) (S465).

When the measured temperature is not the same as the set temperature (NO of S465), the reactor of the second or third process chamber DSV is cleaned by using the unstable supercritical fluid (S466). The cleaning method may be one of the methods of FIGS. 6 to 8.

When the measured temperature is the same as the set temperature (YES of S465), since the state of the supplied supercritical fluid satisfies the set condition, the substrate waiting in the first process chamber ESU is treated with a developing solution (S470). In an embodiment, in response to the state of the supercritical fluid being identified as satisfying the set condition, the substrate in the first process chamber ESU may be treated with a developing solution (S470).

When the substrate is completely treated with the developing solution, the substrate is transferred from the first process chamber ESU to the second or third process chamber DSV. The substrate may be transferred in a state that the developing solution remains on the substrate. In the second or third process chamber DSV, the substrate is dried by replacing the developing solution with a supercritical fluid by using a supercritical fluid that satisfies a set condition (S480).

Then, it is checked whether the dried substrate is the last progressing substrate (S510). In this case, the last progressing substrate means a substrate transferred at the last time among a plurality of substrates in which a developing solution treatment process is to be performed. In an embodiment, the last progressing substrate may mean that there is no substrate waiting to be treated with a developing solution in the first process chamber ESU.

When the substrate is not the last progressing substrate (NO of S510), the substrate is transferred to a fourth process chamber BAKE and a post bake process is performed (S520).

The transfer chamber MTR transfers the substrate, in which bake is completed, from the fourth process chamber BAKE to the buffer chamber WCP. The substrate is cooled in the buffer chamber WCP (S530).

Meanwhile, when the substrate is not the first proceeding substrate (for example, when the substrate is a second proceeding substrate) (NO of S440), the substrate (that is, the second proceeding substrate) transferred into the first process chamber ESU is treated with the developing solution (S490). Also, cleaning is performed for the reactor of the second or third process chamber DSV. In this case, the developing solution treatment process and the cleaning process may be simultaneously performed.

When the substrate is completely treated with the developing solution, the substrate is transferred from the first process chamber ESU to the second or third process chamber DSV so that the developing solution is replaced with a supercritical fluid and dried (S480). The subsequent steps are the same as those described above.

When the substrate is the last progressing substrate (YES of S510), the substrate is transferred to the fourth process chamber BAKE so that post bake is performed, and a processing space 180 in the second or third process chamber DSV is cleaned (S540). The cleaning method may be one of the methods of FIGS. 6 to 8. Since the substrate is the last progressing substrate, the second or third process chamber DSV is not used for a while. Therefore, the cleaning operation is performed to remove particles remaining in the second or third process chamber DSV.

In this case, since the cleaning in the steps S463 and S466 is performed before the start of the drying process, this cleaning is the pre-process cleaning (Pre AVC). Since the cleaning in the step S490 is performed between a pre-drying process and a later drying process, this cleaning is inter-process cleaning (mid AVC). Since the cleaning in the step S540 is performed after all the drying processes are completed, this cleaning is the post-process cleaning (post AVC).

All of the pre-process cleaning, the inter-process cleaning and the post-process cleaning may be the same type of cleaning. For example, the cleaning may be performed in a state that the dummy wafer is seated in the processing space 180.

In an embodiment, at least two of the pre-process cleaning, the inter-process cleaning or the post-process cleaning may be different types of cleaning. For example, the pre-process cleaning and the post-process cleaning may be performed in a state that the dummy wafer is seated, and the inter-process cleaning may be performed in a state that the processing space is empty (i.e., no dummy wafer is present in the processing space). Since the pre-process cleaning should increase the temperature of the supply pipe sufficiently to reach a set temperature or higher and the post-process cleaning should sufficiently remove particles in the processing space, the pre-process cleaning and the post-process cleaning may be performed in a state that the dummy wafer is seated. On the other hand, since the inter-process cleaning should be performed more quickly in order to prevent the entire process time from being delayed, cleaning may be performed in a state that the processing space is empty.

FIG. 13 is a view illustrating a driving method of a substrate processing apparatus according to some embodiments of the present disclosure. In FIG. 13, the processes performed in the reactor of the second or third process chamber DSV shown in FIG. 11 are sequentially listed.

Referring to FIG. 13, a supercritical fluid starts to be supplied, and pre-process cleaning (pre AVC) is performed for a processing space of the reactor (S610). The pre-process cleaning may be the cleaning AVC2 performed in a state that the dummy wafer is seated in the processing space.

Subsequently, a drying process for the first substrate (the developing solution-treated substrate) WF1 is performed (S620).

Then, inter-process cleaning (mid AVC) is performed (S611). The inter-process cleaning may be the cleaning AVC2 performed in a state that the dummy wafer is seated in the processing space.

Subsequently, a drying process for a second substrate (developing solution-treated substrate) WF2 is performed (S621).

Subsequently, inter-process cleaning (mid AVC) is performed (S612). The inter-process cleaning may be the cleaning AVC2 performed in a state that the dummy wafer is seated in the processing space.

Subsequently, a drying process for the last substrate (the developing solution-treated substrate) WFn (n is a natural number greater than or equal to 3) is performed (S629).

Subsequently, post-process cleaning (post AVC) is performed (S630). The post-processing cleaning may be the cleaning AVC2 performed in a state that the dummy wafer is seated in the processing space.

Figure 14:
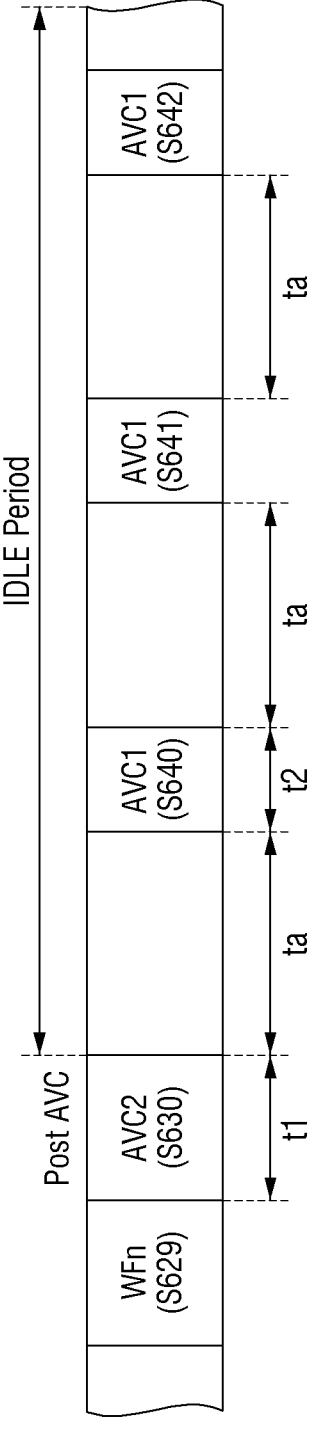
FIG. 14 is a view illustrating a driving method of a substrate processing apparatus according to some embodiments of the present disclosure.

FIG. 14 is a view illustrating a driving method of a substrate processing apparatus according to some embodiments of the present disclosure. In FIG. 14, the processes performed in the reactor of the second or third process chamber DSV shown in FIG. 11 are sequentially listed.

Referring to FIG. 14, a drying process for the last substrate (developing solution-treated substrate) WFn is performed (S629). That is, there is no substrate waiting to be treated with a developing solution in the first process chamber ESU. Therefore, the second or third process chamber DSV is not used for a while. That is, the second or third process chamber DSV enters an idle period.

Subsequently, post-process cleaning (post AVC) is performed (S630). The post-process cleaning may be the cleaning AVC2 performed in a state that the dummy wafer is seated in the processing space.

In the idle period, at least one time cleaning may be performed. For example, when a preset time 'ta' passes in the idle period, interval cleaning steps S640, S641 and S642 may be repeated. In this case, the interval cleaning steps S640, S641 and S642 may be the cleaning AVC1 in a state that the processing space is empty.

As the interval cleaning steps S640, S641 and S642 are performed, the temperature of the supply pipe (390 of FIG. 1) is maintained within a set temperature range, and particles in the processing space inside the reactor 100 are removed. Therefore, when the idle period ends, a new drying process may be quickly and stably started.

A progress time t2 of the interval cleaning steps may be shorter than a progress time t1 of the post-process cleaning (post AVC).

Although the embodiments of the present disclosure have been described with reference to the accompanying drawings, it will be apparent to those skilled in the art that the present disclosure can be fabricated in various forms without being limited to the above-described embodiments and can be embodied in other specific forms without departing from technical spirits and essential characteristics of the present disclosure. Thus, the above embodiments are to be considered in all respects as illustrative and not restrictive.

In concluding the detailed description, those skilled in the art will appreciate that many variations and modifications may be made to the embodiments without substantially departing from the principles of the present inventive concept. Therefore, the disclosed embodiments of the invention are used in a generic and descriptive sense only and not for purposes of limitation.

What is claimed is:

1. A substrate processing apparatus comprising:
a reactor having a processing space formed therein;
a fluid supply unit supplying a supercritical fluid into the processing space of the reactor; and
a controller configured to control the reactor and the fluid supply unit,
wherein the controller controls, in response to whether a state of the supercritical fluid supplied to the reactor satisfies a set condition, the reactor and the fluid supply unit to perform one of cleaning of the processing space by using the supercritical fluid and drying of a substrate seated in the processing space by using the supercritical fluid.

2. The substrate processing apparatus of claim 1,
wherein the controller is configured to control the reactor and the fluid supply unit such that, in the cleaning of the processing space by using the supercritical fluid, a dummy wafer is seated in the processing space, and then the supercritical fluid is supplied into the processing space.

3. The substrate processing apparatus of claim 2,
wherein the dummy wafer is coated with a cleaning fluid for removing particles remaining in the processing space.

4. The substrate processing apparatus of claim 3,
wherein the particles include carbon.

5. The substrate processing apparatus of claim 1,
wherein the controller is configured to control the reactor and the fluid supply unit such that, in the cleaning of the processing space by using the supercritical fluid, the supercritical fluid is supplied into the processing space without any dummy wafer being present.

6. The substrate processing apparatus of claim 1,
wherein the controller is configured to control the reactor and the fluid supply unit such that, during a time when the cleaning of the processing space is performed,
the supercritical fluid in the processing space is exhausted; and
a pressure of the processing space reaches a preset pressure, and then the pressure of the processing space repeatedly increases and decreases within a range of the preset pressure.

7. The substrate processing apparatus of claim 1,
wherein the controller is configured to control the reactor and the fluid supply unit such that, in the drying of the substrate seated in the processing space by using the supercritical fluid, the substrate with a developing solution remaining thereon is seated in the processing space and the supercritical fluid is supplied into the processing space to remove the developing solution remaining on the substrate.

8. The substrate processing apparatus of claim 1,
wherein the set condition includes a set temperature and a set pressure for maintaining the supercritical fluid at a supercritical state,
wherein the fluid supply unit includes:
a reservoir storing the supercritical fluid, and
a supply pipe connecting the reservoir to the reactor, and
wherein at least a portion of the supply pipe is exposed to a temperature lower than the set temperature and a pressure lower than the set pressure.

* * * * *